US012063788B2

(12) United States Patent
Dowben et al.

(10) Patent No.: US 12,063,788 B2
(45) Date of Patent: Aug. 13, 2024

(54) THIN FILM MOLECULAR MEMORY

(71) Applicants: BOARD OF REGENTS OF THE UNIVERSITY OF NEBRASKA, Lincoln, NE (US); BOARD OF REGENTS, THE UNIVERSITY OF TEXAS SYSTEM, Austin, TX (US); GEORGIA TECH RESEARCH CORPORATION, Atlanta, GA (US); THE TRUSTEES OF INDIANA UNIVERSITY, Bloomington, IN (US); THE REGENTS OF THE UNIVERSITY OF CALIFORNIA, Oakland, CA (US)

(72) Inventors: Peter A. Dowben, Crete, NE (US); Ruihua Cheng, Indianapolis, IN (US); Xiaoshan Xu, Lincoln, NE (US); Alpha T. N'Diaye, Berkeley, CA (US); Aaron Mosey, Indianapolis, IN (US); Guanhua Hao, Lincoln, NE (US); Thilini K. Ekanayaka, Lincoln, NE (US); Xuanyuan Jiang, Gainesville, FL (US); Andrew J. Yost, Stillwater, OK (US); Andrew Marshall, Dallas, TX (US); Azad J. Naeemi, Atlanta, GA (US)

(73) Assignees: NUTECH VENTURES, Lincoln, NE (US); GEORGIA TECH RESEARCH CORPORATION, Atlanta, GA (US); THE TRUSTEES OF INDIANA UNIVERSITY, Bloomington, IN (US); BOARD OF REGENTS, THE UNIVERSITY OF TEXAS SYSTEM, Austin, TX (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 194 days.

(21) Appl. No.: 17/583,858

(22) Filed: Jan. 25, 2022

(65) Prior Publication Data
US 2022/0238537 A1 Jul. 28, 2022

Related U.S. Application Data

(60) Provisional application No. 63/141,288, filed on Jan. 25, 2021.

(51) Int. Cl.
*H10B 51/30* (2023.01)
*G11C 11/56* (2006.01)
(Continued)

(52) U.S. Cl.
CPC .......... *H10B 51/30* (2023.02); *G11C 11/5607* (2013.01); *H01L 29/516* (2013.01);
(Continued)

(58) Field of Classification Search
CPC ........ H10B 51/30; H10B 61/00; H10B 61/10; H10B 61/22; G11C 11/5607; H01L 29/516; H01L 29/78391
See application file for complete search history.

(56) References Cited

U.S. PATENT DOCUMENTS

| 9,373,783 B1* | 6/2016 | DeBrosse | H10N 50/01 |
| 2010/0244897 A1* | 9/2010 | Saito | G11C 11/16 |
| | | | 326/49 |
| 2014/0001524 A1* | 1/2014 | Manipatruni | H10B 61/22 |
| | | | 257/E27.005 |

FOREIGN PATENT DOCUMENTS

| DE | 102019104916 A1 * | 10/2019 | ........... G11C 11/155 |
| WO | WO-2017052622 A1 * | 3/2017 | |
| WO | WO-2018125038 A1 * | 7/2018 | ............. G11C 5/063 |

OTHER PUBLICATIONS

Bairagi, Kaushik et al., "Temperature-, Light-, and Soft X-ray-Induced Spin Crossover in a Single Layer of Fe II—Pyrazolylborate Molecules in Direct Contact with Gold," The Journal of Physical Chemistry C, Jan. 11, 2018 (Accessible Dec. 11, 2017), pp. 727-731, vol. 122, issue 1.
(Continued)

*Primary Examiner* — Matthew E Warren
(74) *Attorney, Agent, or Firm* — Talem IP Law, LLP

(57) ABSTRACT

A thin film molecular memory is provided that satisfies criteria needed to make a molecular spintronic device, based on spin crossover complexes, competitive with silicon technology. These criteria include, device implementation, a low coercive voltage (less than 1V) and low write peak currents (on the order of $10^4$ A/cm$^2$), a device on/off ratio >10, thin film quality, the ability to "lock" the spin state (providing nonvolatility), the ability to isothermally "unlock" and switch the spin state with voltage, conductance change with
(Continued)

spin state, room temperature and above room temperature operation, an on-state device resistivity less than 1 Ω·cm, a device fast switching speed (less than 100 ps), device endurance (on the order of $10^{16}$ switches without degradation), and the ability of having a device with a transistor channel width of 10 nm or below.

20 Claims, 5 Drawing Sheets

(51) Int. Cl.
    *H01L 29/51*     (2006.01)
    *H01L 29/78*     (2006.01)
    *H10B 61/00*     (2023.01)

(52) U.S. Cl.
    CPC ....... *H01L 29/78391* (2014.09); *H10B 61/10* (2023.02); *H10B 61/22* (2023.02)

(56) References Cited

OTHER PUBLICATIONS

Iasco, O. et al., "The disentangling of hysteretic spin transition, polymorphism and metastability in bistable thin films formed by sublimation of bis(scorpionate) Fe( ii ) molecules," Journal of Materials Chemistry C, Oct. 2, 2017, pp. 11067-11075, vol. 5, issue 42.
Fourmental, Cynthia et al., "Importance of Epitaxial Strain at a Spin-Crossover Molecule-Metal Interface," The Journal of Physical Chemistry Letters, Jul. 18, 2019 (Accesssible Jul. 2, 2019), pp. 4103-4109, vol. 10, issue 14.
Atzori, Matteo et al., "Thermal and light-induced spin transition in a nanometric film of a new high-vacuum processable spin crossover complex," Journal of Materials Chemistry C, Jul. 31, 2018, pp. 8885-8889, vol. 6, issue 33.
Zhao, Tian et al., "A novel fabrication of [Fe(HB(pz)3)2]@MIL-101 hybrid material via diffusion and the lower temperature shift on its spin transition behavior," Applied Physics A, Sep. 3, 2019, p. 670 (1-6), vol. 125, issue 9.
Warner, Ben et al., "Temperature- and Light-Induced Spin Crossover Observed by X-ray Spectroscopy on Isolated Fe(II) Complexes on Gold," The Journal of Physical Chemistry Letters, May 2, 2013 (Accessible Apr. 17, 2013), pp. 1546-1552, vol. 4, issue 9.
Pronschinske, Alex et al., "Iron(ii) spin crossover films on Au(111): scanning probe microscopy and photoelectron spectroscopy," Chemical Communications, Sep. 12, 2013, pp. 10446-10452, vol. 49, issue 89.
Pronschinske, Alex et al., "Modification of Molecular Spin Crossover in Ultrathin Films," Nano Letters, Apr. 10, 2013 (Accessible Mar. 21, 2013), pp. 1429-1434, vol. 13, issue 4.
Zhang, Xin et al., "Electronic Structure of a Spin Crossover Molecular Adsorbate," The Journal of Physical Chemistry C, Nov. 8, 2012 (Accessible Oct. 10, 2012), pp. 23291-23296, vol. 116, issue 44.
Beniwal, S et al., "Surface-induced spin state locking of the [Fe(H 2 B(pz) 2 ) 2 (bipy)] spin crossover complex," Journal of Physics: Condensed Matter, May 25, 2016 (Accessible Apr. 27, 2016), pp. 206002 (1-8), vol. 28, issue 20.
Palamarciuc, Tatiana et al., "Spin crossover materials evaporated under clean high vacuum and ultra-high vacuum conditions: from thin films to single molecules," Journal of Materials Chemistry, Apr. 10, 2012, p. 9690-95, vol. 22, issue 19.
Naggert, Holger et al., "First observation of light-induced spin change in vacuum deposited thin films of iron spin crossover complexes," Dalton Transactions, May 19, 2011, pp. 6364-6366, vol. 40, issue 24.
Jiang, Xuanyuan, et al., "Tunable spin-state bistability in a spin crossover molecular complex," Journal of Physics: Condensed Matter, Aug. 7, 2019 (Accessible May 22, 2019), pp. 315401 (1-8), vol. 31.
Zhang, Xin, et al., "The spin state of a molecular adsorbate driven by the ferroelectric substrate polarization," Chemical Communications, Dec. 3, 2013, pp. 2255-2257, vol. 50, issue 18.
Zhang, Xin et al., "Locking and Unlocking the Molecular Spin Crossover Transition," Advanced Materials, Oct. 2017, pp. 1702257 (1-10), vol. 29, issue 39.
Zhang, Xin et al., "Indications of magnetic coupling effects in spin cross-over molecular thin films," Chemical Communications, Jan. 2, 2018, pp. 944-947, vol. 54, issue 8.
Kipgen, Lalminthang et al., "Evolution of cooperativity in the spin transition of an iron(II) complex on a graphite surface," Nature Communications, Jul. 30, 2018, 8 pages, vol. 9, issue 1, article 2984.
Kipgen, Lalminthang et al., "Soft-x-ray-induced spin-state switching of an adsorbed Fe(II) spin-crossover complex," Journal of Physics: Condensed Matter, Oct. 4, 2017 (Accessible Aug. 22, 2017), 8 pages, vol. 29, issue 39.
Wackerlin, Christian et al., "Excited Spin-State Trapping in Spin Crossover Complexes on Ferroelectric Substrates," The Journal of Physical Chemistry C, Apr. 19, 2018 (Accessible Mar. 29, 2018), pp. 8202-8208, vol. 122, issue 15.
Hernandez, Edna M. et al., "AFM Imaging of Molecular Spin-State Changes through Quantitative Thermomechanical Measurements," Advanced Materials, May 2014, pp. 2889-2893, vol. 26, issue 18.
Bas, Alin-Ciprian et al., "Effects of solvent vapor annealing on the crystallinity and spin crossover properties of thin films of [Fe(HB(tz)3)2]," Comptes Rendus Chimie, Jun. 2019 (Accessible Apr. 19, 2019), pp. 525-533, vol. 22.
Rat, S. et al., "Solvatomorphism and structural-spin crossover property relationship in bis[hydrotris(1,2,4-triazol-1-yl) borate]iron( ii )," CrystEngComm, May 18, 2017, pp. 3271-3280, vol. 19, issue 24.
Costa, Paulo et al., "Perturbing the spin crossover transition activation energies in Fe(H 2 B(pz) 2 ) 2 (bipy) with zwitterionic additions," Journal of Physics: Condensed Matter, Aug. 1, 2018 (Accessible Jul. 5, 2018), p. 305503 (1-5), vol. 30, issue 30.
Guillaume, Francois et al., "Photoswitching of the spin crossover polymeric material [Fe(Htrz)2(trz)](BF4) under continuous laser irradiation in a Raman scattering experiment," Chemical Physics Letters, Jun. 2014 (Accessible Apr. 23, 2014), pp. 105-109, vol. 604.
Etrillard, Celine et al., "Photoconduction in [Fe(Htrz)2(trz)](BF4)-H2O nanocrystals," Chemical Communications, May 11, 2011, pp. 9663-9665, vol. 47, issue 34.
Rosner, Benedikt et al., "Reversible Photoswitching of a Spin-Crossover Molecular Complex in the Solid State at Room Temperature," Angewandte Chemie, Oct. 26, 2015, pp. 13168-13172, vol. 127, issue 44.
Hasegawa, Yuta et al., "Reversible light-induced magnetization change in an azobenzene-attached byridylbenzimidazole complex of iron(ii) at room temperature," Dalton Trans., 2009 (Accessible Nov. 25, 2008), pp. 280-284, issue 2.
Poggini, Lorenzo et al., "Room temperature control of spin states in a thin film of a photochromic iron( ii ) complex," Materials Horizons, Mar. 12, 2018, pp. 506-513, vol. 5, issue 3.
Takahashi, Kazuhiro et al., "Solid-State Ligand-Driven Light-Induced Spin Change at Ambient Temperatures in Bis(dipyrazolylstyrylpyridine)iron(II) Complexes," Inorganic Chemistry, May 7, 2012 (Accessible Apr. 11, 2012), pp. 5188-5198, vol. 51, issue 9.
Milek, Magdalena et al., "Spin Crossover Meets Diarylethenes: Efficient Photoswitching of Magnetic Properties in Solution at Room Temperature," Inorganic Chemistry, Oct. 7, 2013 (Accessible Sep. 24, 2013), pp. 11585-11592, vol. 52, issue 19.
Bune, A. V. et al., "Two-dimensional ferroelectric films," Nature, Feb. 26, 1998 (Accessible Oct. 28, 1997), pp. 874-877, vol. 391, issue 6670.
Jiang, Xuanyuan et al., "Room temperature ferroelectricity in continuous croconic acid thin films," Applied Physics Letters, Sep. 6, 2016, pp. 102902 (1-4), vol. 109, issue 10.

(56) References Cited

OTHER PUBLICATIONS

Blinov, L. M. et al., "Two-dimensional ferroelectrics," Physics-Uspekhi (Uspekhi Fizicheskikh Nauk), Mar. 2000, pp. 243-257, vol. 170, issue 3.
Kimura, Kuniko et al., "Polarization Behavior in Vinylidene Fluoride-Trifluoroethylene Copolymer Thin Films," Japanese Journal of Applied Physics, Mar. 1, 1986, p. 383-87, vol. 25, issue 3R.
Ducharme, Stephen et al., "Intrinsic Ferroelectric Coercive Field," Physical Review Letters, Jan. 3, 2000, pp. 175-178, vol. 84, issue 1.
Carvell, Jeffrey et al., "Study of electrical polarization hysteresis in ferroelectric polyvinylidene fluoride films," Materials Letters, Sep. 2010 (Accessible Jun. 19, 2010), pp. 1992-1995, vol. 64, issue 18.
Qu, Hongwei et al., "Nanoscale polarization manipulation and conductance switching in ultrathin films of a ferroelectric copolymer," Applied Physics Letters, Jun. 16, 2003 (Accessible Jun. 10, 2003), pp. 4322-4324, vol. 82, issue 24.
Chu, Baojin et al., "A Dielectric Polymer with High Electric Energy Density and Fast Discharge Speed," Science, Jul. 21, 2006, pp. 334-336, vol. 313, issue 5785.
Horiuchi, Sachio et al., "Above-room-temperature ferroelectricity in a single-component molecular crystal," Nature, Feb. 11, 2010 (Accessible Nov. 26, 2009), pp. 789-793, vol. 463, issue 7282.
Garcia, Vincent et al., "Ferroelectric tunnel junctions for information storage and processing," Nature Communications, Jul. 24, 2014, p. 4289 (1-12), vol. 5, issue 1.
Dawber, M. et al., "Physics of thin-film ferroelectric oxides," Reviews of Modern Physics, Oct. 17, 2005 (Accessible Mar. 15, 2015), pp. 1083-1130, vol. 77, issue 4.
Chen, Jason et al., "Interface control of surface photochemical reactivity in ultrathin epitaxial ferroelectric films," Applied Physics Letters, May 9, 2013, pp. 182904 (1-5), vol. 102, issue 18.
Kholkin, A. L. et al., "Self-polarization effect in Pb(Zr,Ti)O 3 thin films," Integrated Ferroelectrics, Mar. 1998 (Online Aug. 19, 2006), pp. 525-533, vol. 22.
Duan, Chun-Gang et al., "Simulations of ferroelectric polymer film polarization: The role of dipole interactions," Physical Review B, Jun. 21, 2004, pp. 235106 (1-6), vol. 69, issue 23.
Aravena, Daniel et al., "Coherent Transport through Spin-Crossover Single Molecules," Journal of the American Chemical Society, Jan. 18, 2012 (Accesssible Dec. 22, 2011), pp. 777-779, vol. 134, issue 2.
Mahfoud, Tarik et al., "Electric-Field-Induced Charge-Transfer Phase Transition: A Promising Approach Toward Electrically Switchable Devices," Journal of the American Chemical Society, Oct. 21, 2009 (Accessible Sep. 29, 2009), pp. 15049-15054, vol. 131, issue 41.
Takahashi, Kazuyuki et al., "Electrical Conductivity Modulation Coupled to a High-Spin-Low-Spin Conversion in the Molecular System [Fe III (qsal) 2 ][Ni(dmit) 2 ] 3 -CH 3 CN-H 2 O," Inorganic Chemistry, Jul. 1, 2006 (Accessible Jun. 21, 2006), pp. 5739-5741, vol. 45, issue 15.
Phan, Hoa et al., "Photomagnetic Response in Highly Conductive Iron(II) Spin-Crossover Complexes with TCNQ Radicals," Angewandte Chemie International Edition, Jan. 12, 2015, pp. 823-827, vol. 54, issue 3.
Dorbes, Stephane et al., "[Fe(sal2-trien)][Ni(dmit)2]: towards switchable spin crossover molecular conductors," Chemical Communications, 2005 (Accessible Nov. 16, 2004), pp. 69-71.
Ekanayaka, Thilini K. et al., "Nonvolatile Voltage Controlled Molecular Spin-State Switching for Memory Applications," Magnetochemistry, Mar. 11, 2021, 20 pages, vol. 7, issue 3, article 37.
Kahn, O. et al., "Spin-Transition Polymers: From Molecular Materials Toward Memory Devices," Science, Jan. 2, 1998, pp. 44-48, vol. 279, issue 5347.
Bousseksou, Azzedine et al., "Molecular spin crossover phenomenon: recent achievements and prospects," Chemical Society Reviews, 2011, pp. 3313-3335, vol. 40, issue 6.
Bousseksou, Azzedine et al., "Observation of a thermal hysteresis loop in the dielectric constant of spin crossover complexes: towards molecular memory devices," J. Mater. Chem., Jul. 9, 2003, pp. 2069-2071, vol. 13, issue 9.
Kumar, Kuppusamy Senthil et al., "Emerging trends in spin crossover (SCO) based functional materials and devices," Coordination Chemistry Reviews, Sep. 2017 (Accessible Mar. 31, 2017), pp. 176-205, vol. 346.
Molnar, Gabor et al., "Spin Crossover Nanomaterials: From Fundamental Concepts to Devices," Advanced Materials, Feb. 2018, pp. 1703862 (1-23), vol. 30, issue 5.
Rotaru, Aurelian et al., "Nano-electromanipulation of Spin Crossover Nanorods: Towards Switchable Nanoelectronic Devices," Advanced Materials, Mar. 25, 2013, pp. 1745-1749, vol. 25, issue 12.
Lefter, Constantin et al., "Charge Transport and Electrical Properties of Spin Crossover Materials: Towards Nanoelectronic and Spintronic Devices," Magnetochemistry, Mar. 11, 2016, 19 pages, vol. 2, issue 1, article 18.
Kumar, Kuppusamy Senthil et al., "Sublimable Spin-Crossover Complexes: From Spin-State Switching to Molecular Devices," Angewandte Chemie International Edition, Mar. 29, 2021, pp. 7502-7521, vol. 60, issue 14.
Lefter, Constantin et al., "Unidirectional electric field-induced spin-state switching in spin crossover based microelectronic devices," Chemical Physics Letters, Jan. 2016 (Accessible Nov. 30, 2015), pp. 138-141, vol. 644.
Konstantinov, Nikita et al., "Electrical read-out of light-induced spin transition in thin film spin crossover/graphene heterostructures," Journal of Materials Chemistry C, 2021, pp. 2712-2720, vol. 9, issue 8.
Mahfoud, Tarik et al., "Electrical properties and non-volatile memory effect of the [Fe(HB(pz) 3 ) 2 ] spin crossover complex integrated in a microelectrode device," Applied Physics Letters, Aug. 2011, pp. 053307 (1-3), vol. 99, issue 5.
Hao, Guanhua et al., "The emergence of the local moment molecular spin transistor," Journal of Physics: Condensed Matter, May 27, 2020 (Accessible Mar. 12, 2020), pp. 234002 (1-15), vol. 32, issue 23.
Hao, G. et al., "Nonvolatile voltage controlled molecular spin state switching," Applied Physics Letters, Jan. 22, 2019, pp. 032901 (1-5), vol. 114, issue 3.
Mosey, Aaron et al., "Quantitative Study of the Energy Changes in Voltage-Controlled Spin Crossover Molecular Thin Films," The Journal of Physical Chemistry Letters, Oct. 1, 2020 (Accessible Sep. 3, 2020), pp. 8231-8237, vol. 11, issue 19.
Khusniyarov, Marat M., "How to Switch Spin-Crossover Metal Complexes at Constant Room Temperature," Chemistry—A European Journal, Oct. 17, 2016, pp. 15178-15191, vol. 22, issue 43.
Prins, Ferry et al., "Room-Temperature Electrical Addressing of a Bistable Spin-Crossover Molecular System," Advanced Materials, Apr. 5, 2011, pp. 1545-1549, vol. 23, issue 13.
Weber, Birgit et al., "Preface to the JPCM Special Issue on Molecular Magnetism," Journal of Physics: Condensed Matter, Oct. 21, 2020 (Accessible Aug. 11, 2020), pp. 440201 (1-3), vol. 32, issue 44.
Jian-Gang Zhu, "Magnetoresistive Random Access Memory: The Path to Competitiveness and Scalability," Proceedings of the IEEE, Nov. 2008, pp. 1786-1798, vol. 96, issue 11.
Yu, Shimeng et al., "Emerging Memory Technologies: Recent Trends and Prospects," IEEE Solid-State Circuits Magazine, Jun. 21, 2016, pp. 43-56, vol. 8, issue 2.
Senni, Sophiane et al., "Exploring MRAM Technologies for Energy Efficient Systems-On-Chip," IEEE Journal on Emerging and Selected Topics in Circuits and Systems, Sep. 2016, pp. 279-292, vol. 6, issue 3.
Liao, Yu-Ching et al., "Benchmarking and Optimization of Spintronic Memory Arrays," IEEE Journal on Exploratory Solid-State Computational Devices and Circuits, Jun. 1, 2020, pp. 9-17, vol. 6, issue 1.
E. Kitagawa et al., "STT-MRAM cuts power use by 80%," EE Times, Apr. 15, 2013, Retrieved: Jul. 19, 2022. Retrieved from: https://www.eetimes.com/stt-mram-cuts-power-use-by-80/, 9 pages.
Wang, K L et al., "Low-power non-volatile spintronic memory: STT-RAM and beyond," Journal of Physics D: Applied Physics, Feb. 20, 2013 (Accessible Jan. 31, 2013), pp. 074003 (1-10), vol. 46, issue 7.

(56) References Cited

OTHER PUBLICATIONS

Zhang, Kun et al., "Rectified Tunnel Magnetoresistance Device With High On/Off Ratio for In-Memory Computing," IEEE Electron Device Letters, Jun. 2020, pp. 928-931, vol. 41, issue 6.

Patel, Ravi et al., "2T-1R STT-MRAM memory cells for enhanced on/off current ratio," Microelectronics Journal, Feb. 2014 (Accessible Dec. 31, 2013), pp. 133-143, vol. 45, issue 2.

Ohsawa, T. et al., "Trend of tunnel magnetoresistance and variation in threshold voltage for keeping data load robustness of metal-oxide-semiconductor/magnetic tunnel junction hybrid latches," Journal of Applied Physics, May 7, 2014 (Accessible Feb. 28, 2014), pp. 17C728 (1-3), vol. 115, issue 17.

Cobo, Saioa et al., "Multilayer Sequential Assembly of Thin Films That Display Room-Temperature Spin Crossover with Hysteresis," Angewandte Chemie International Edition, Sep. 4, 2006, pp. 5786-5789, vol. 45, issue 35.

Molnar, G. et al., "A Combined Top-Down/Bottom-Up Approach for the Nanoscale Patterning of Spin-Crossover Coordination Polymers," Advanced Materials, Aug. 17, 2007, pp. 2163-2167, vol. 19, issue 16.

Miyamachi, Toshio et al., "Robust spin crossover and memristance across a single molecule," Nature Communications, Jul. 3, 2012, pp. 938 (1-6), vol. 3, issue 1.

Briois, V. et al., "Full Multiple Scattering and Crystal Field Multiplet Calculations Performed on the Spin Transition FeII(phen)2(NCS)2 Complex at the Iron K and L2,3 X-ray Absorption Edges," Journal of the American Chemical Society, Jan. 1995, pp. 1019-1026, vol. 117, issue 3.

Gruber, Manuel et al., "Spin state of spin-crossover complexes: From single molecules to ultrathin films," Physical Review B, May 13, 2014, pp. 195415 (1-9), vol. 89, issue 19.

Ellingsworth, Edward C. et al., "Thermal conversion of [Fe(phen)3](SCN)2 thin films into the spin crossover complex Fe(phen)2(NCS)2," RSC Advances, 2013, pp. 3745-3754, vol. 3, issue 11.

Beniwal, Sumit et al., "Site selective adsorption of the spin crossover complex Fe(phen)2(NCS) on Au(111)," Journal of Physics: Condensed Matter, Jul. 29, 2020 (Accessible May 15, 2020), pp. 324003 (1-5), vol. 32, issue 32.

Shi, S. et al., "Study of molecular spin-crossover complex Fe(phen)2(NCS)2 thin films," Applied Physics Letters, 27 Jul. 29, 2009, pp. 043303 (1-3), vol. 95, issue 4.

Gopakumar, Thiruvancheril G. et al., "Spin-Crossover Complex on Au(111): Structural and Electronic Differences Between Mono- and Multilayers," Chemistry—A European Journal, Nov. 11, 2013, pp. 15702-15709, vol. 19, issue 46.

Poggini, Lorenzo et al., "Temperature-induced transport changes in molecular junctions based on a spin crossover complex," Journal of Materials Chemistry C, 2019, pp. 5343-5347, vol. 7, issue 18.

Lefter, Constantin et al., "Current Switching Coupled to Molecular Spin-States in Large-Area Junctions," Advanced Materials, Sep. 2016, pp. 7508-7514, vol. 28, issue 34.

Ludwig, E. et al., "Iron(II) Spin-Crossover Complexes in Ultrathin Films: Electronic Structure and Spin-State Switching by Visible and Vacuum-UV Light," Angewandte Chemie International Edition, Mar. 10, 2014, pp. 3019-3023, vol. 53, issue 11.

Schleicher, Filip et al., "Linking Electronic Transport through a Spin Crossover Thin Film to the Molecular Spin State Using X-ray Absorption Spectroscopy Operando Techniques," ACS Applied Materials & Interfaces, Sep. 19, 2018, pp. 31580-31585, vol. 10, issue 37.

Bernien, Matthias et al., "Highly Efficient Thermal and Light-Induced Spin-State Switching of an Fe(II) Complex in Direct Contact with a Solid Surface," ACS Nano, Sep. 22, 2015 (Accessible Aug. 12, 2015), pp. 8960-8966, vol. 9, issue 9.

Gopakumar, Thiruvancheril G. et al., "Electron-Induced Spin Crossover of Single Molecules in a Bilayer on Gold," Angewandte Chemie International Edition, Jun. 18, 2012, pp. 6262-6266, vol. 51, issue 25.

Poggini, Lorenzo et al., "Vertical Tunnel Junction Embedding a Spin Crossover Molecular Film," Advanced Electronic Materials, Dec. 2018, pp. 1800204 (1-8), vol. 4, issue 12.

Shalabaeva, Victoria et al., "Room temperature current modulation in large area electronic junctions of spin crossover thin films," Applied Physics Letters, Jan. 5, 2018, pp. 013301 (1-5), vol. 112, issue 1.

Zhang, Yuteng et al., "Resistance switching in large-area vertical junctions of the molecular spin crossover complex [Fe(HB(tz) 3 ) 2 ]: On/Off ratios and device stability," Journal of Physics: Condensed Matter, May 13, 2020 (Accessible Feb. 27, 2020), pp. 214010 (1-7), vol. 32, issue 21.

Ridier, Karl et al., "Finite Size Effects on the Switching Dynamics of Spin-Crossover Thin Films Photoexcited by a Femtosecond Laser Pulse," Advanced Materials, Jun. 2019, pp. 1901361 (1-7), vol. 31, issue 25.

Ridier, Karl et al., "Unprecedented switching endurance affords for high-resolution surface temperature mapping using a spin-crossover film," Nature Communications, Jul. 17, 2020, pp. 3611 (1-9), vol. 11, issue 1.

Zhang, Luqiong et al., "Anomalous Light-Induced Spin-State Switching for Iron(II) Spin-Crossover Molecules in Direct Contact with Metal Surfaces," Angewandte Chemie International Edition, Aug. 3, 2020, pp. 13341-13346, vol. 59, issue 32.

Bairagi, Kaushik, et al., "Molecular-scale dynamics of light-induced spin cross-over in a two-dimensional layer," Nature Communications, Jul. 18, 2016, pp. 12212 (1-7), vol. 7, issue 1.

Geest, Erik P. et al., "Contactless Spin Switch Sensing by Chemo-Electric Gating of Graphene," Advanced Materials, Mar. 2020, 9 pages, vol. 32, issue 10.

Dugay, J. et al., "Phase Transitions in Spin-Crossover Thin Films Probed by Graphene Transport Measurements," Nano Letters, Jan. 11, 2017, pp. 186-193, vol. 17, issue 1.

Mucciolo, E. R. et al., "Disorder and electronic transport in graphene," Journal of Physics: Condensed Matter, Jul. 14, 2010 (Accessible Jun. 23, 2010), 13 pages, vol. 22, issue 27.

Wurm, Jurgen et al., "Edge effects in graphene nanostructures: From multiple reflection expansion to density of states," Physical Review B, Aug. 12, 2011, pp. 075468 (1-18), vol. 84, issue 7.

Wimmer, Michael et al., "Spin Currents in Rough Graphene Nanoribbons: Universal Fluctuations and Spin Injection," Physical Review Letters, May 2, 2008, 4 pages, vol. 100, issue 17.

Han, Melinda Y. et al., "Electron Transport in Disordered Graphene Nanoribbons," Physical Review Letters, Feb. 1, 2010, pp. 056801 (1-4), vol. 104, issue 5.

Shi, Yi-Jian et al., "Four-terminal impedance of a graphene nanoribbon based structure," The European Physical Journal B, Oct. 27, 2014, 5 pages, vol. 87, issue 10.

Tanaka, Daisuke et al., "Facile preparation of hybrid thin films composed of spin-crossover nanoparticles and carbon nanotubes for electrical memory devices," Dalton Transactions, 2019 (Accessible Oct. 16, 2018), pp. 7074-7079, vol. 48, issue 21.

Hauser, Andreas, "Intersystem crossing in Fe(II) coordination compounds," Coordination Chemistry Reviews, Dec. 1991, pp. 275-290, vol. 111.

Horiuchi, Sachio et al., "Above-room-temperature ferroelectricity and antiferroelectricity in benzimidazoles," Nature Communications, Dec. 18, 2012, 6 pages, vol. 3, issue 1.

Horiuchi, Sachio et al., "Hydrogen-Bonded Architectures and Field-Induced Polarization Switching in Bridged Bis (benzimidazole) Crystals," Crystal Growth Design, Jan. 2, 2019 (Accessible Dec. 5, 2012), pp. 328-335, vol. 19, issue 1.

Yamane, Hiroyuki et al., "Elucidation and Control of Energy Level Alignment at Organic/Metal Interfaces," Hyomen Kagaku, 2008 (Accessible Nov. 25, 2007), pp. 99-104, vol. 29, issue 2.

Ishii, Hisao et al., "Energy Level Alignment and Interfacial Electronic Structures at Organic/Metal and Organic/Organic Interfaces," Advanced Materials, Jun. 1999, pp. 605-625, vol. 11, issue 8.

Braun, Slawomir et al., "Energy-Level Alignment at Organic/Metal and Organic/Organic Interfaces," Advanced Materials, Apr. 20, 2009, pp. 1450-1472, vol. 21, issue 14-15.

(56) References Cited

OTHER PUBLICATIONS

Tokarev, Alexey et al., "Cooperative spin crossover phenomena in [Fe(NH2trz)3](tosylate)2 nanoparticles," Chemical Communications, Sep. 27, 2010, p. 8011-13, vol. 46, issue 42.
Wang, Kang L. et al., "Magnetoelectric Random Access Memory-Based Circuit Design by Using Voltage-Controlled Magnetic Anisotropy in Magnetic Tunnel Junctions," IEEE Transactions on Nanotechnology, Nov. 2015, pp. 992-997, vol. 14, issue 6.
George, Sumitha et al., "Nonvolatile memory design based on ferroelectric FETs," Proceedings of the 53rd Annual Design Automation Conference, Jun. 5, 2016, pp. 1-6, ACM, Austin Texas.
Peng, Xiaochen et al., "DNN+NeuroSim: An End-to-End Benchmarking Framework for Compute-in-Memory Accelerators with Versatile Device Technologies," 2019 IEEE International Electron Devices Meeting (IEDM), Dec. 2019, p. 32.5.1-32.5.4, IEEE, San Francisco, CA, USA.
Fernandes, Cristina et al., "A Sustainable Approach to Flexible Electronics with Zinc-Tin Oxide Thin-Film Transistors," Advanced Electronic Materials, Jul. 2018, p. 1800032 (1-10), vol. 4, issue 7.
Kamiya, Toshio et al., "Present status of amorphous In—Ga—Zn—O thin-film transistors," Science and Technology of Advanced Materials, Sep. 10, 2010, pp. 044305 (1-23), vol. 11, issue 4.
Everspin Technologies, "EMD4E001G Family Datasheet," Feb. 9, 2018, 38 pages, Everspin Technologies.
Everspin Technologies, "EMD4E001GAS2 Datasheet," Aug. 2020, 175 pages, Everspin Technologies.
Avalanche Technology, "Discrete MRAM," Sep. 8, 2020, Captured: Jan. 17, 2021, Retrieved: Jul. 7, 2023, Retrieved from: http:/web.archive.org/web/20210117071337/https://www.avalanche-technology.com/products/discrete-mram/, 1 page.
Cambi, L. et al., "Uber die magnetische Susceptibilitat der komplexen Verbindungen," Berichte Der Deutschen Chemischen Gesellschaft (A and B Series), Nov. 11, 1931, pp. 2591-2598, vol. 64, issue 10.
Cambi, L. et al., "Uber die magnetische Susceptibilitat der komplexen Verbindungen (II. Mitteil.).," Berichte Der Deutschen Chemischen Gesellschaft (A and B Series), May 3, 1933, pp. 656-661, vol. 66, issue 5.
Cambi, Livio et al., "Magnetismus und Polymorphie innerer Komplexsalze: Eisensalze der Dithiocarbamidsauren," Berichte Der Deutschen Chemischen Gesellschaft (A and B Series), Oct. 6, 1937, pp. 2067-2078, vol. 70, issue 10.
Gruber, Manuel et al., "Spin crossover in Fe(phen) 2 (NCS) 2 complexes on metallic surfaces," The Journal of Chemical Physics, Mar. 7, 2017, pp. 092312 (1-13), vol. 146, issue 9.
Hao, Guanhua et al., "Magnetic Field Perturbations to a Soft X-Ray Activated Fe (II) Molecular Spin State Transition," Preprint, Aug. 18, 2021, 13 pages, Physical Sciences.

\* cited by examiner

THIN FILM MOLECULAR MEMORY

CROSS-REFERENCE TO RELATED APPLICATION

This application claims the benefit of U.S. Provisional Application Ser. No. 63/141,288, filed Jan. 25, 2021.

STATEMENT REGARDING FEDERALLY SPONSORED RESEARCH

This invention was made with government support under DE-AC02-05CH11231 awarded by the United States Department of Energy and under DMR2003057, DMR1420645, and ECCS1740136 awarded by the National Science Foundation. The government has certain rights in the invention.

BACKGROUND

The design of flexible and high-density nonvolatile memory devices remains an area of interest for obtaining high-speed computer memory. Organic electronics is one area of research. Organic electronics involve polymers, small molecules, and other forms of organic materials that are used for optoelectronic and electronic functionalities. By leveraging the intrinsic spin of electrons and associated magnetic moments of these organic materials, it is possible to create spintronic/magnetoelectronic devices. The voltage control of the magnetic states of these organic materials enables nonvolatile device elements whose state may be switched without large current densities and power consumption.

Accordingly, there is need in the art for molecular systems to deliver low-power nonvolatile magnetoelectric memory operations.

BRIEF SUMMARY

Thin film molecular memory is described. The thin film molecular memory is a nonvolatile memory compatible with back end of line (BEOL) silicon processing and can be used as cache memory as well as a replacement for flash memory and transistors in flexible displays. The thin film molecular memory uses voltage controlled molecular spin state switching.

A thin film molecular memory is provided that satisfies criteria needed to make a molecular spintronic device, based on spin crossover complexes, competitive with silicon technology. These criteria include, device implementation, a low coercive voltage (less than 1V) and low write peak currents (on the order of $10^5$ A/cm$^2$), a device on/off ratio >10, thin film quality, the ability to "lock" the spin state (providing nonvolatility), the ability to isothermally "unlock" and switch the spin state with voltage, conductance change with spin state, room temperature and above room temperature operation, an on-state device resistivity less than 1 Ω·cm, a device fast switching speed (less than 100 ps), device endurance (on the order of more than $10^{11}$ switches without degradation), and the ability of having a device with a transistor channel width of 10 nm or below.

Advantageously, as described herein, it is possible to produce a nonvolatile memory compatible with BEOL silicon processing that is scalable and faster, cheaper, and less energy expensive (<1 fJ/device) than spin-transfer torque (SST) RAM. The described thin film molecular memory can replace spin orbit torque (SOT) RAM. The BEOL processing advantage means that nonvolatile cache memory can be placed in intimate contact with logic.

Accordingly, a system can be fabricated that includes a circuit substrate; and a thin film molecular memory deposited on the circuit substrate in a back end of line process. The thin film molecular memory is formed of a ferroelectric layer adjacent to a spin crossover molecular layer having a channel thickness of at least 10 nm (and can even be 50 nm thick). The circuit substrate can include transistor devices. In some cases, the memory devices of the thin film molecular memory are electrically connected to the transistor devices of the circuit substrate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 6A shows [Fe(1,10-phenanthroline)$_2$(NCS)$_2$], frequently written as Fe(phen)$_2$(NCS)$_2$. FIG. 6B shows [Fe{H$_2$B(pz)$_2$}$_2$(bipy)] where (H$_2$B (pz)$_2$=bis(hydrido)bis(1H-pyrazol-1-yl)borate, bipy=2,2'-bipyridine). FIG. 6C shows [Fe{H$_2$B(pz)$_2$}$_2$phen] where again (H$_2$B(pz)$_2$=dihydrobis(1H-pyrazol-1-yl)borate). FIG. 6D shows [Fe(HB(tz)$_3$)$_2$] (tz=1,2,4-triazol-1-yl). FIG. 6E shows [Fe(HB(3,5-(CH$_3$)$_2$(pz)$_3$)$_2$], pz=pyrazolyl]. FIG. 6F shows [Fe(qnal)$_2$] where qnal=quinoline-naphthaldehyde.

DETAILED DESCRIPTION

Figure 1A:
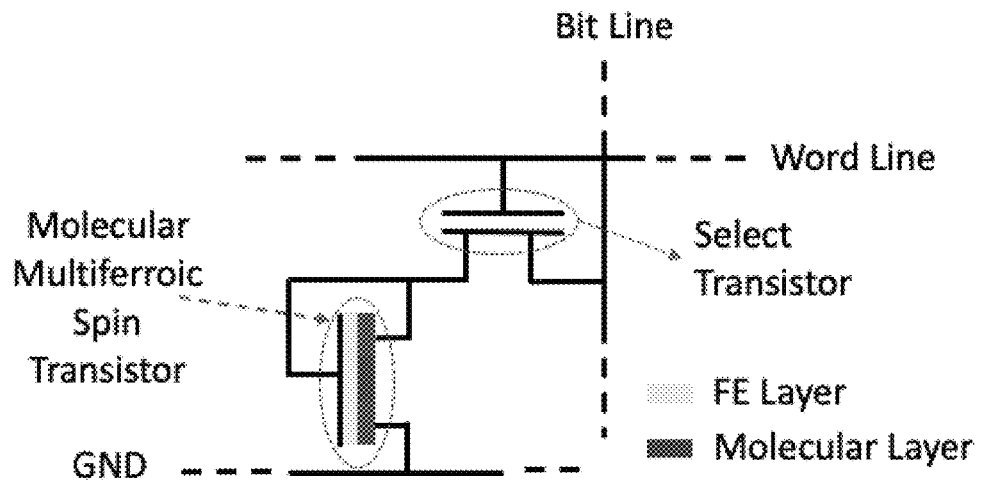
FIG. 1A shows an example schematic of a nonvolatile memory element utilizing a multiferroic spin transistor made by spin crossover molecular heteromolecular systems.

Thin film molecular memory is described. The thin film molecular memory is a nonvolatile memory compatible with back end of line (BEOL) silicon processing and can be used as cache memory as well as a replacement for flash memory and transistors in flexible displays. The thin film molecular memory uses voltage controlled molecular spin state switching.

A system can be fabricated that includes a circuit substrate and a thin film molecular memory deposited on the circuit substrate in a back end of line process. The thin film molecular memory is formed of a ferroelectric layer adjacent to a spin crossover molecular layer having a channel thickness of at least 10 nm (and can even be 50 nm thick). The circuit substrate can include transistor devices. The transistor devices can be complementary metal oxide semiconductor (CMOS) transistors. In some cases, the memory devices of the thin film molecular memory are electrically connected to the transistor devices of the circuit substrate. In some implementations, the thin film molecular memory comprises a two-terminal diode memory device. In some implementations, the thin film molecular memory comprises a four-terminal transistor memory device.

Molecular systems have the very real possibility of providing a room temperature device on a length scale less than 10 nm while delivering low power nonvolatile local magnetoelectric memory operations. It has been suggested that the spin crossover (SCO) phenomenon, which relates to the transition between a low spin (LS) diamagnetic state of the metal ion to a high-spin (HS) paramagnetic state in 3d transition metal compounds, has potential applicability in molecular spintronic devices. There is now clear evidence that a molecular multiferroic device is possible. Voltage-controlled isothermal changes in the electronic structure of the spin crossover molecular system have now been achieved for the Fe(II) spin crossover complexes such as $[Fe\{H_2B(pz)_2\}_2(bipy)]$, where pz=tris(pyrazol-1-yl)-borohydride and bipy=2,2'-bipyridine. This isothermal voltage-controlled switching is evident in an applied electric field. The higher conductance occurs at high spin state while lower conductance for low spin state. Because these molecular thin films are easily fabricated, and compatible with flexible substrates, it is possible to fabricate low-cost molecular solid-state memory with large ON/OFF ratio from the next generation of molecular spintronic devices.

A thin film molecular memory is provided that satisfies criteria needed to make a molecular spintronic device, based on spin crossover complexes, competitive with silicon technology. These criteria include, device implementation, a low coercive voltage (less than 1 V) and low write peak currents (on the order of $10^5$ A/cm$^2$), a device on/off ratio >10, thin film quality, the ability to "lock" the spin state (providing nonvolatility), the ability to isothermally "unlock" and switch the spin state with voltage, conductance change with spin state, room temperature and above room temperature operation, an on-state device resistivity less than 1 Ω·cm, a device fast switching speed (less than 100 ps), device endurance (on the order of $10^{16}$ switches without degradation), and the ability of having a device with a transistor channel width of 10 nm or below.

Figure 1B:
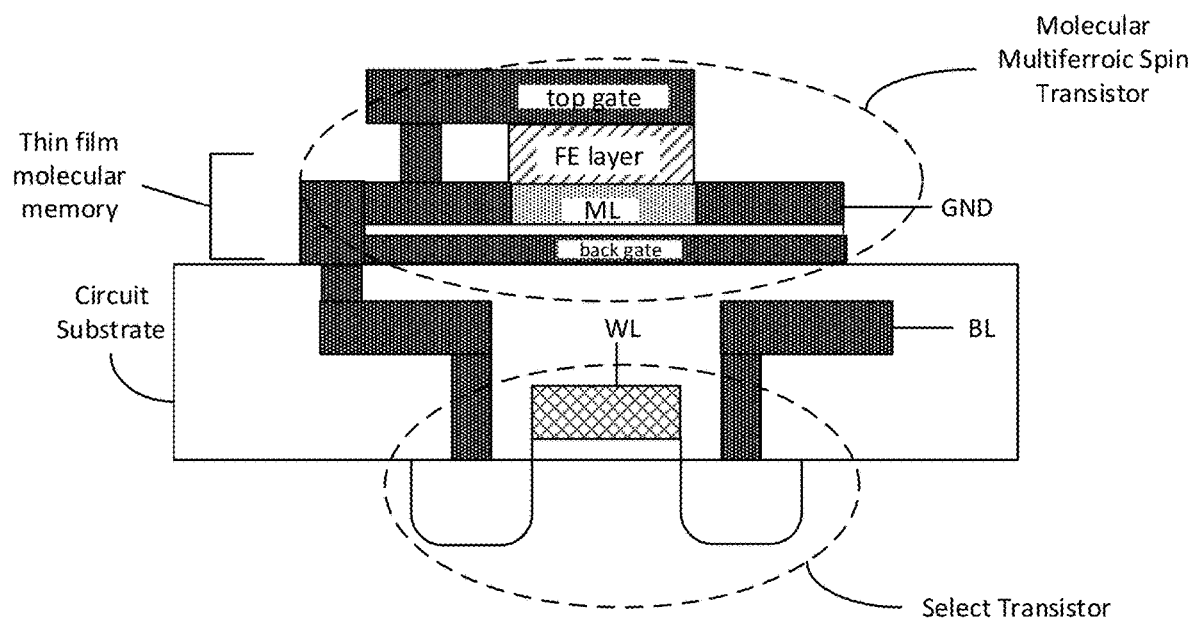
FIG. 1B shows a simplified schematic cross-section of the nonvolatile memory element of FIG. 1A.

Regarding device implementation, FIG. 1A shows a schematic of an example nonvolatile memory element cell. FIG. 1B shows a simplified schematic cross-section of the nonvolatile memory element of FIG. 1A. This memory cell is based on the design of a field effect voltage-controlled spin state molecular transistor and can exploit the differential between the low-resistance and high resistance states of a voltage-controlled spin state molecular memory device fabricated from spin crossover complexes. However, unlike DRAM (dynamic random-access memory), where charge storage on the cell must be refreshed periodically, molecular spin state memory is nonvolatile and the output is resistive. This is particularly useful when low-power memory is needed.

It should be understood that this nonvolatile memory element is not the only implementation scheme for nonvolatile spin crossover molecular devices.

Regarding the criteria of a low coercive voltage (less than 1V) and low write peak currents (on the order of $10^5$ A/cm$^2$), it is possible to achieve these properties through use of a thin ferroelectric layer adjacent to the spin crossover molecular layer. Indeed, molecular ferroelectric gate dielectrics can be made as thin as 1 nm and still be reliable, and the coercive voltage would be <0.5 V. A gate dielectric 2 nm thick would be "worry free" with a coercive voltage of about 0.8 V or less. Accordingly, a thin film molecular memory can be formed of a ferroelectric layer less than 5 nm thick adjacent to a spin crossover molecular layer, as illustrated in FIG. 1B (not to scale). The desire for faster write speeds, means that the peak current densities needed to provide the correct ferroelectric polarization at the gate will also scale up. There is a trade-off between faster write speeds and lower peak current densities for a 'write' operation.

In detail, working nonvolatile molecular spin crossover devices make use of a ferroelectric layer adjacent to the spin crossover molecular layer. Thus, the coercive voltage of the device tends to be dominated by the coercive voltage of ferroelectric layer. The choice of molecular ferroelectric also plays a role.

In some cases, the ferroelectric layer is formed of dipolar molecular additives. In some cases, the ferroelectric layer is formed of organic ferroelectric material. In some cases, the ferroelectric layer comprises benzimidazole, 2-methylbenzimidazole, 5,6-dichloro-2-methylbenzimidazole, bridged bis (benzimidazole), croconic acid, or a copolymer of polyvinylidene fluoride.

Figure 2:
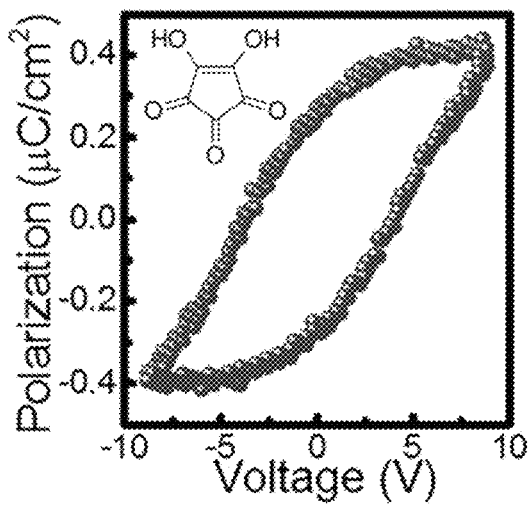
FIG. 2 shows a plot of the polarization hysteresis of a 185 nm thick ferroelectric croconic acid thin film.

As shown in FIG. 2, coercive voltages of 1.5 V have been obtained for a 5-layer poly(vinylidene fluoride with trifluoroethylene) film and a roughly 5 V has been obtained for both 35 nm and 185 nm thick croconic acid thin films, respectively. The good news here is that the coercive voltage for the ferroelectric layer tends to scale with the ferroelectric layer film thickness, but sadly this scaling with film thickness appears to be far from perfect in the thin film limit. Yet for a critical electric field $E_{cr}$ of roughly 50 MVm$^{-1}$ and 0.2-0.4 GVm$^{-1}$ have been estimated for poly(vinylidene fluoride with trifluoroethylene) films meaning that coercive voltages of 50 mV to 0.2 V are possible for bilayer thick molecular films of about 1 nm thickness. Even with failures of scaling in the thin film limit, coercive voltages of less than 0.5 V should be possible for bilayer thick molecular films. The critical electric field $E_{cr}$ of less than 2 MVm$^{-1}$ for croconic acid, means that coercive voltages less than 3 mV might be possible, which in fact would be too small to be practical, so thicker and thus more reliable ferroelectric thin films would be required.

While there have been some successes with inorganic ferroelectric layers influencing the spin state of an adjacent molecular spin crossover complex thin film, in general the problems with the inorganic ferroelectric layers are that, apart from PbZr$_{0.2}$Ti$_{0.8}$O$_3$ (PZT), the coercive voltages tend to be somewhat higher, outside of the tunnel junction geometry where the coercive voltages also are in the range of 1 V. In the very thinnest of oxide ferroelectric films, ferroelectric polarization retention tends to be lower. Indeed, our experience is that in the very thin oxide ferroelectric films, one ferroelectric polarization is favored so the retention of one ferroelectric polarization is favored over another.

Thin film oxide ferroelectrics, even when grown on oxide surfaces, tend to exhibit preferential upward polarization (C+). This is not desirable in a nonvolatile device destined for memory applications. For the oxides, surface defects abound. How a spin crossover complex will bond at such defects sites is not yet clear, so concerns remain that spin state switching will be suppressed for spin crossover complexes residing at such oxide surface imperfections.

Organic ferroelectric thin films are also far from perfect in their behavior. First there is the problem that the faster the switching speed, the higher the coercive voltage needed. Second, the coercive voltages for each ferroelectric polarization direction may differ as the film thickness decreases. The loss of symmetry in the coercive voltage can be the result of the interface with a conducting contact. Finally, there is the problem that the polarization hysteresis is not "square", meaning that the application of higher voltage, the coercive voltage, may be necessary to achieve full polarization.

If the current density is 1 electron per molecule in 1 ns, this translates into an overall minimum current density of $3.6 \times 10^5$ A/cm$^2$. This approaches the industry goal of a current density of $10^4$ A/cm$^2$. This is because the gate supply needs to be able to do two things: (1) be able to make the device switch the ferroelectric polarization of what is the gate dielectric, and hence the spin state in the spin crossover molecular layer (where the latter plays the role of the semiconductor channel in the transistor geometry) at a reasonable supply voltage. In other words, the gate supply voltage should not be too high and not too low. If the gate supply voltage required is too high, then the implementation of room temperature nonvolatile spin crossover transistor molecular devices would require high voltage supplies or charge pumps on chip in order to program a memory device. This is why EEPROM is not a very popular non-volatile memory device—it simply requires too much supply voltage to make it a very usable memory. If the gate supply voltages are too significant, this would limit the application of nonvolatile spin crossover transistor molecular devices to one-time-programmable memory only. If, on the other hand, the programming voltage could be brought down to a very low value, it has the advantage of making the memory chip easy to program, but circuitry then has to be carefully designed to ensure that accidental programming does not occur especially during the read operations. (2) The second factor to be considered is speed of write. While less important than ability to write a memory cell, speed is none-the-less important, and becomes more important in memory applications requiring a fast write time. Unfortunately, the writing or programing voltage and the write speed requirements can act against each other in operational memory, since the lower programming or write voltage, the better it is for write time, but reducing programming voltage too much increases the chances of a write "disturb" event.

Figure 3A:
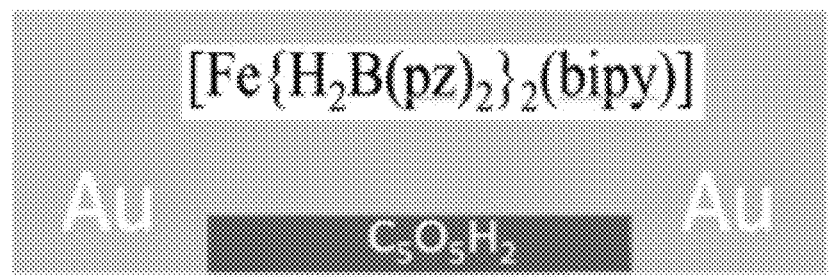
FIG. 3A shows a two-terminal diode-like device structure of a 20 nm [Fe{H2B(pz)2}2(bipy)] thin film deposited on croconic acid thin film.
Figure 3B:
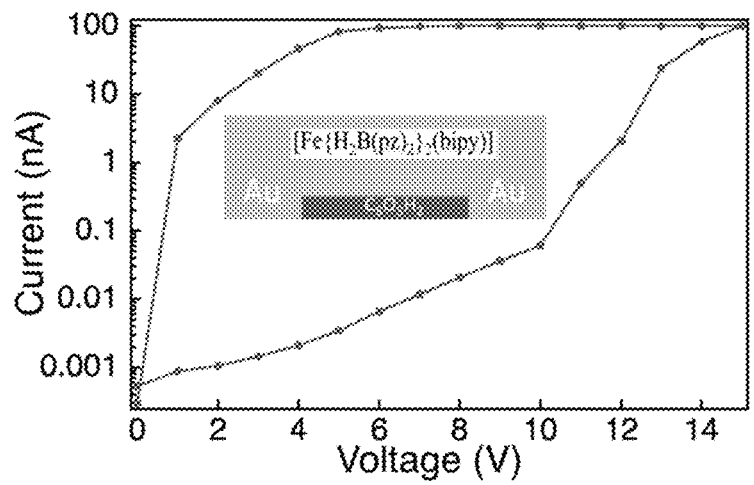
FIG. 3B shows a plot of conductance change in the device of FIG. 3A, showing high on/off ratio.
Figure 4:
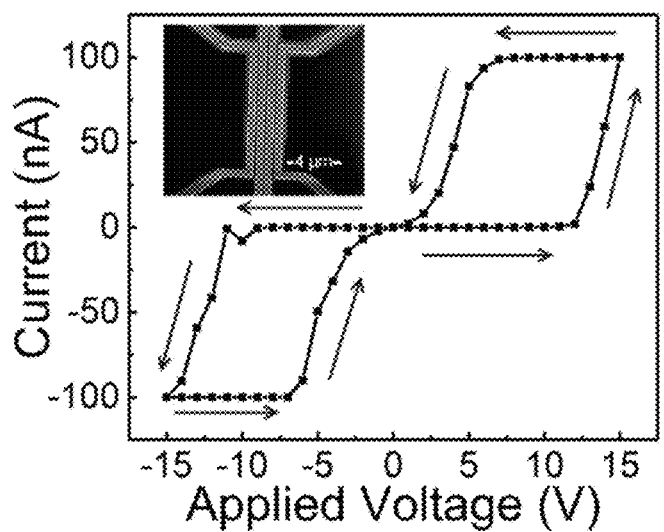
FIG. 4 shows the conductance change with applied voltage to the device of FIG. 3A, showing a loss of nonvolatility. Longitudinal voltage was applied on different junctions and the measurement was taken at room temperature.

Regarding a device on/off ratio of greater than 10, the initial working nonvolatile molecular devices, based on the spin crossover complex [Fe{H$_2$B(pz)$_2$}$_2$(bipy)], had an on/off ratio of about 6, for the device in the transistor geometry. This has now been improved to an on/off ratio greater than 100, even the spin state switching is seen to be incomplete. With more complete spin state switching, the on/off ratio will improve. One indication of the possible molecular spintronic device on/off ratio comes from the 2-terminal diode like device, such as shown in FIG. 3A, as opposed to the top and bottom gated transistor device. Here current ON/OFF ratio of $10^4$ has been obtained, with $10^3$ near threshold voltage. This high ON/OFF ratio, as seen in FIG. 3B, suggests that the changes in conductance, associated with a spin state change, can be engineered to be very significant. Thus, such devices, based on a change of molecular spin state, should exhibit a high level of fidelity in possible molecular electronics applications. This is obviously a volatile conductance switching that arises in a two terminal device when the ferroelectric layer is more homogeneous, as indicated in FIG. 4. While a homogeneous ferroelectric layer is very desirable for nonvolatile molecular multiferroics devices in the transistor geometry because the ferroelectric is a gate dielectric layer for one of the gates (either top or bottom). In the diode geometry a uniform ferroelectric layer is less effective, suggesting that the voltage control of spin state switching arises not from the electric field, but from interface effects, as suggested elsewhere. Yet nonvolatility is possible in the longitudinal conductance for a two terminal diode device.

Indeed, the nonvolatile conductance change now exceeds 10 in the most recent working nonvolatile multiferroic devices fabricated from spin crossover molecular complexes. The on to off ratio is greater than 10 and frequently greater than 100 in many of the 2 terminal volatile devices. These higher (>10) on/off ratios are good for a memory cell and eases the pathway to implementation. This is because, in practice, memory cells are not typically uniform. There is a statistical range of cell resistances and device to device on/off ratios. As the on-off ratio decreases, there is a point where on-off ratio is sufficient so there is an overlap between the "high" state and the "low" state. When this occurs, there is the potential for error, which in some cases can be corrected, but at the expense of error correction circuitry.

Figure 5:
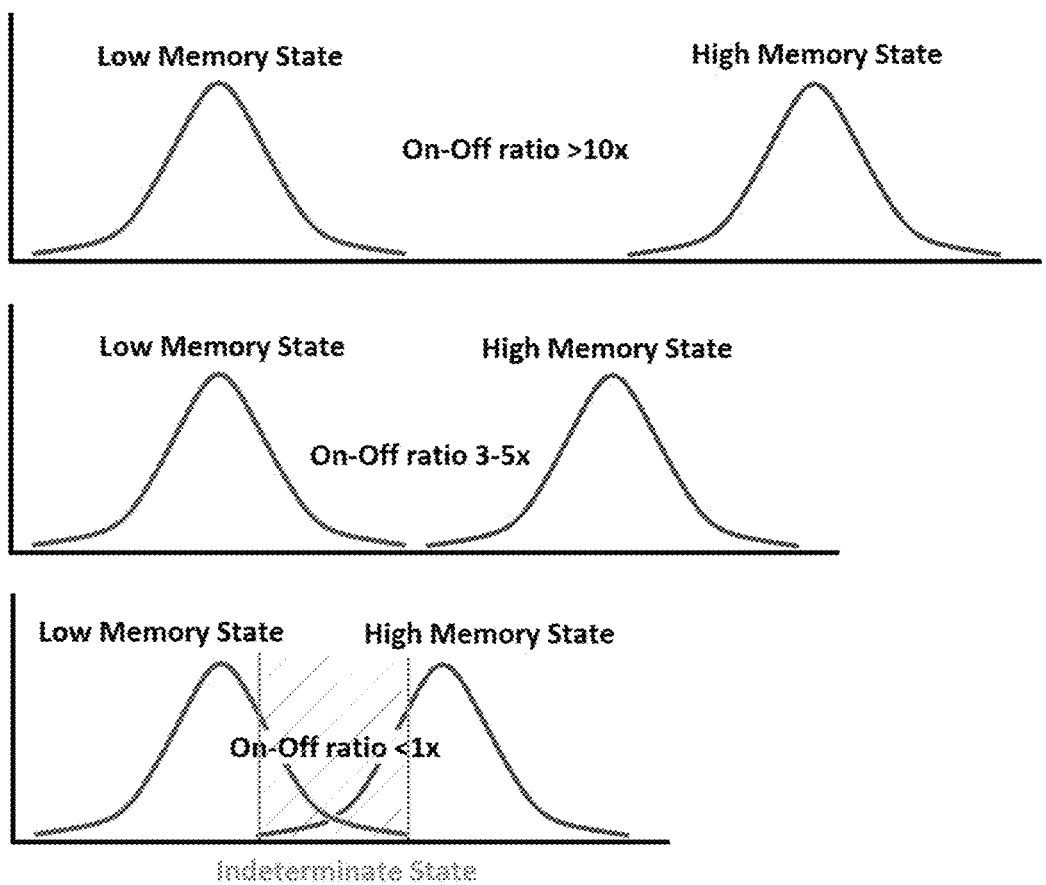
FIG. 5 illustrates the on/off ratio requirements for memory cells.

FIG. 5 illustrates the on/off ratio requirements for memory cells. Here, the issue of state overlap if on/off ratio is reduced too much can be seen. There is a statistical variation in the conductance in both the on and the off states, between memory cells in a memory array, and this results in a range of "Low" and "High" conductance states associated with the low and high spin states. If the on/off ratio is reduced too much, an indeterminate state can occur, where it is not clear which state the memory cell is in. As the on/off ratio reduces, it takes longer to isolate the correct state when doing a read function. Read time is typically more important than write time, since typically there are more read than write cycles, especially in non-volatile memory configurations. A moderately high ratio of more than $10^3$ allows for faster sense amplifiers and a variety of memory configurations. This suggests that there is promise for these types of devices and the existing devices are more than adequate for memory applications from the perspective of the on/off ratio.

Regarding the criteria of thin film quality, a competitive device requires scalability. This is to say that there has to be a route to large scale manufacturability. There are basically three approaches. These are to build a spin crossover thin film architectures chemically, as has been done as in the case of [Fe-(pz){Pd(CN$_4$)}], evaporate a thin film, or spin coat a thin film from solution.

Figure 6A:
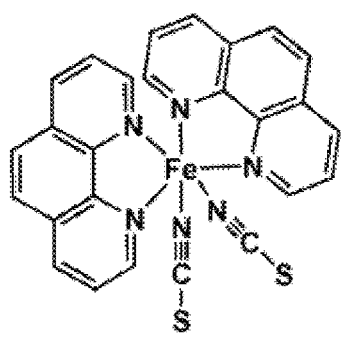
FIGS. 6A-6F show example spin crossover complexes that can be evaporated as molecular thin films for the described devices.
Figure 6B:
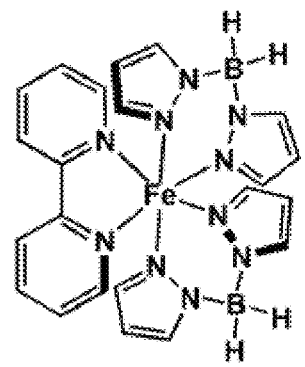
Figure 6C:
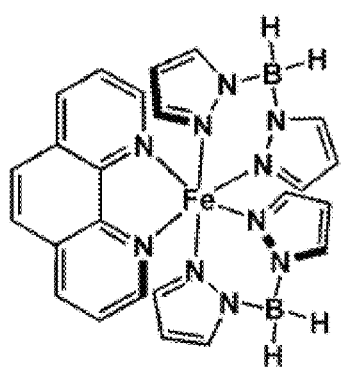
Figure 6D:
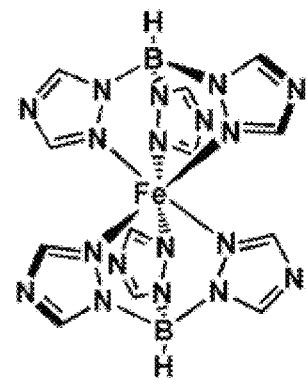
Figure 6E:
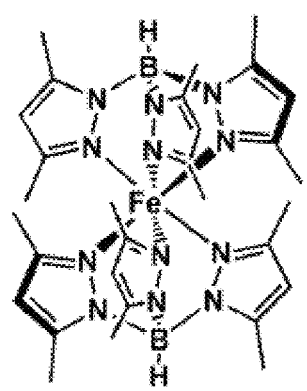
Figure 6F:
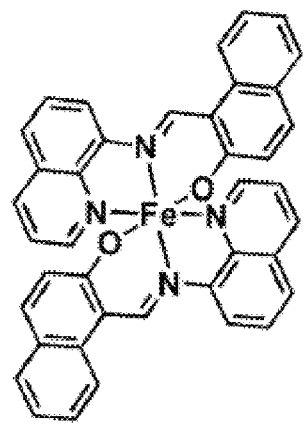

The more widely used approach to film fabrication is to evaporate a thin film of spin crossover molecules. This will not work with all spin crossover molecular systems, because the sublimation process must leave the molecules "intact" and the condensation process must result in a suitable molecular packing on the local scale (at least), so that the properties that change across the spin transition can be exploited reproducibly. The requirements tend to exclude molecular salts and polymers as neither can be evaporated readily. Yet the approach has been successfully applied to [Fe(1,10-phenanthroline)$_2$(NCS)$_2$] (frequently known as Fe(phen)$_2$(NCS)$_2$), as illustrated in FIG. 6A, [Fe(H$_2$B(pz)$_2$)$_2$phen] where H$_2$B(pz)$_2$=dihydrobis(1H-pyrazol-1-yl)borate, as illustrated in FIG. 6C, [Fe(HB(tz)$_3$)$_2$] (tz=1,2,4-triazol-1-yl), as illustrated in FIG. 6D, [Fe(HB(3,5-(CH$_3$)$_2$)(pz)$_3$)$_2$], where pz=pyrazolyl, as illustrated in FIG. 6E, [Fe(qnal)$_2$] where qnal=quinoline-naphthaldehyde, as illustrated in FIG. 6F, [Fe(HB(pz)$_3$)$_2$] where pz=pyrazolyl and the molecule that is the focus of this review: [Fe{H$_2$B(pz)$_2$}$_2$(bipy)] where (H$_2$B(pz)$_2$=bis(hydrido)bis(1H-pyrazol-1-yl)borate, bipy=2,2'-bipyridine), as illustrated in FIG. 6B. For the purposes of these devices, any spin crossover complex that can be evaporated intact, retains intermolecular interactions (i.e., cooperative effects), couples to the molecular substrate, has a large resistance change associated with the change in spin state, and has a low on state resistance could be suitable for such a device as described here. Accordingly, there are variety of Fe$^{2+}$ and Co$^{2+/3+}$ spin crossover complexes that can be considered.

Another approach would be to spin coat the molecular layers from solution, as in the case of Fe(hptrz)$_3$](OTs)$_2$ (hptrz=4-heptyl-1,2,4-triazole, OTs=tosylate). [Fe(Htrz)$_2$(trz)](BF$_4$) plus polyaniline composites shows considerable promise because the onstate resistance is well below 1 Ω·cm. The problem here is that solvent effects are known to alter the characteristics of the spin state transition for some spin crossover complexes. This is not likely to be an insurmountable problem, but realistically, the molecular solubility and solvent effects are issues that would have to be addressed if this were chosen as the route to large scale device fabrication. Presently, efforts to explore solubility and solvent effects are only in their infancy.

Accordingly, in some implementations, the ferroelectric layer of the described memory devices is fabricated by evaporation. In some implementations, the ferroelectric layer is fabricated by Langmuir-Blodgett thin film growth.

Regarding the ability to "lock" the spin state, a competitive nonvolatile device requires locking of the spin state in the region of room temperature, as has been achieved with the inclusion of both dipolar molecular additives, as well as from the influence of the substrate. Key here is that the polarization of a ferroelectric interface can preferentially favor the adoption of the high or low spin state of an adjacent spin cross molecular thin film. It is important to note that this influence of the ferroelectric substrate domain polarization extends away from the interface with ferroelectric and well into the adjacent spin cross molecular thin film. The exact mechanisms for this influence of the substrate on the spin state of the molecular spin crossover complex thin film have not been precisely identified but intermolecular cooperative effects are implicated in the influence of the substrate on the adjacent spin cross molecular thin film. The fact that the interface polarization influences the spin state occupancy significantly for molecular spin crossover complex thin films up to 20 molecular layers, and for even greater film thicknesses in a somewhat diminished manner means that device fabrication does not require precise and stringent film thickness choices, easing the constraints.

It is noted that the surface of the molecular spin crossover complex thin film may have a different spin state occupancy than the rest of the film. Furthermore, when the device is both top and bottom gated, the molecular spin crossover complex thin film will be influenced by two different interfaces.

Regarding the ability to isothermally "unlock" and switch the spin state with voltage, a competitive nonvolatile molecular spin crossover device requires change of the spin state, ideally with voltage, from one nonvolatile state to another. This is the device "write" operation. Recent work suggests that an applied magnetic field could reduce the activation barrier to a change in spin state, but as with light activation of a spin state change, this does not seem to lend itself towards a readily applicable memory application. Just the same, isothermal spin state and conductance switching has been demonstrated. It is this achievement of nonvolatile voltage control of the molecular spin state that opens to door to potential practical applications.

Figure 7:
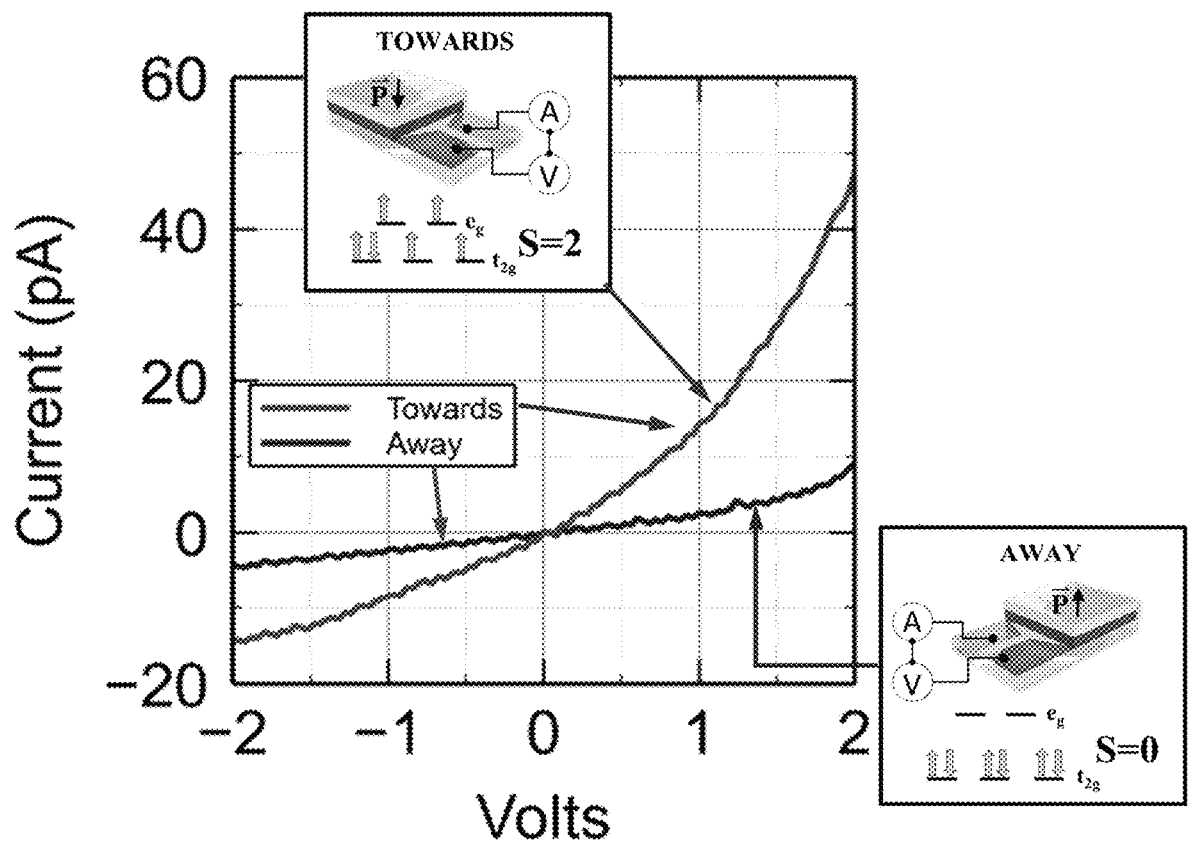
FIG. 7 shows a plot of the conductance change seen in a [Fe{H$_2$B(pz)$_2$}$_2$(bipy)], where py=tris(pyrazole-1-yl)-borohydride and bipy=2,2'-bipyridine), with the reversal of the ferroelectric polarization in an adjacent ferroelectric polyvinylidene fluoride hexafluoropropylene (PVDF-HFP) layer, either towards or away from the molecular spin crossover [Fe{H$_2$B(pz)$_2$}$_2$(bipy)].

Along with the device write operation, a nonvolatile molecular device requires a read operation. So far, the read operation has been successfully exploiting the conductance change that accompanies the change in molecular spin state, as seen in FIG. 7. It is known that the difference between the highest occupied molecular orbital to lowest unoccupied molecular orbital is much larger (by about 2 eV) compared to the gap between low spin state and high spin state of [Fe{H$_2$B(pz)$_2$}$_2$(bipy)]. A smaller band gap for the high spin state of [Fe{H$_2$B(pz)$_2$}$_2$(bipy)] is consistent with a higher conductance, and this higher conductance is seen in working room temperature devices. This type of conductance change has been observed with other spin crossover complexes, like [Fe(bpz)$_2$phen], Fe(trans-bis(3-(2-pyridyl)(1,2,3)triazolo(1-5)pyridine)bis(isothiocyanato)], Rb$_{0.8}$Mn[Fe(CN)$_6$]$_{0.93}$·1.62H$_2$O, [Fe(trz)$_3$](BF$_4$)$_2$ (trz=triazole), [Fe(phen)$_2$(NCS)$_2$], and [FeIII(qsal)$_2$][Ni(dmit)$_2$]$_3$·CH$_3$CN·H$_2$O, although in these latter examples the conductance change was volatile. Accordingly, isothermal switching of conductance in a nonvolatile spin crossover molecular device is possible.

Regarding room temperature operation of a nonvolatile spin crossover molecular device, there are now working nonvolatile molecular devices fabricated from spin crossover complexes that work not only at room temperature, but to temperatures well above room temperature. So far, working nonvolatile molecular device operation has been demonstrated to temperatures as high as 350 K. The molecules that can be evaporated as thin films typically sublime between 433 K and 510 K, suggesting molecular stability to at least this region of temperature. While these higher temperatures have not yet tested in the working device, it does suggest that operational temperatures may be possible. But too high a temperature may lead to material loss even if it does not lead to molecular degradation. Overall, given the current status, it does seem that nonvolatile molecular devices fabricated from spin crossover complexes are operational over a wide enough temperature range to both practical and competitive.

Regarding on-state resistivity, from the nonvolatile multiferroic molecular devices two terminal diode-like devices, it can be estimated that the resistance in the on state is about 10$^3$ Ω·cm and 10$^6$ Ω·cm in the off state for a spin crossover device based on [Fe{H$_2$B(pz)$_2$}$_2$(bipy)]. For a nanoscale device, this presents a serious problem because if the resistance scales with size, the nanoscale device will have a total resistance that diminishes utility.

Here a resistance of 10$^3$ Ω·cm translates to a device resistance of 5 GΩ when the dimensions of the device are reduced to a 10 nm width, a source to drain distance of 10 nm and a film thickness of 2 nm according to:

$$R = \rho \frac{L}{WT} = 10^3 \times 10^{-2}(\Omega \cdot m) \frac{10 \times 10^{-9} m}{(10 \times 10^{-9} m)(2 \times 10^{-9})} 5 G\Omega.$$

This 5 GΩ resistance is simply too high a resistance to be valuable from an applications point of view, especially as this may not correctly include resistance at the molecules to metal contact interface. The large impedance will lead to delay times that are simply too long to be competitive. It can be realized that [Fe{H$_2$B(pz)$_2$}$_2$(bipy)] is probably not the most desirable spin crossover complex for competitive nonvolatile molecular devices for memory applications. Other spin crossover molecular complexes are reported with lower on-state resistance of 5 Ω·cm for the spin crossover molecules [Fe(tpma)(xbim)](X)(TCNQ)1.5·DMF (X=ClO4) and [FeIII(sal$_2$-trien)][Ni(dmit)$_2$]. An even lower on-state resistance of 0.5 Ω·cm has been reported for the spin crossover molecule [FeIII(qsal)$_2$][Ni(dmit)$_2$]$_3$·CH$_3$CN·H$_2$O. Even lower resistance has been reported for [Fe(Htrz)$_2$(trz)](BF$_4$) plus polyaniline composites. This strongly suggests that the reduction of the intrinsic resistance of a spin crossover molecular system is a problem that can be addressed by some adroit synthetic chemistry. For the purposes of these devices, any spin crossover complex that can be evaporated intact, or is soluble in a solvent from which a molecular thin film can be drop cast may be suitable so long as the resulting spin crossover thin film retains intermolecular interactions (i.e., cooperative effects), couples to the molecular substrate, has a large resistance change associated with the change in spin state, and has a low on state resistance could be suitable for such a device as described here. Accordingly, there are variety of Fe$^{2+}$, Co$^{2+/3+}$ and Mn$^{3+}$ spin crossover complexes that can be considered.

Figure 8:
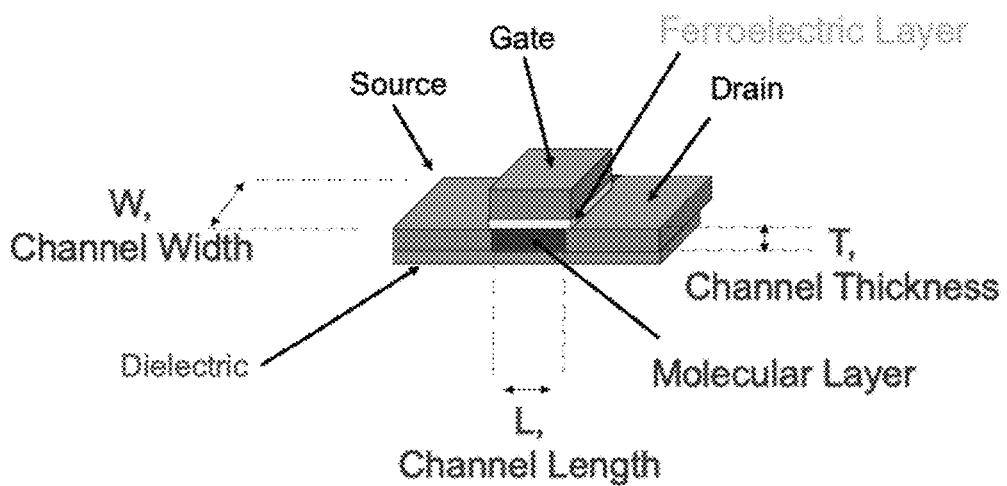
FIG. 8 shows a schematic of critical dimensions of a nonvolatile molecular transistor device fabricated from spin crossover complexes.

FIG. 8 shows a schematic of critical dimensions of a nonvolatile molecular transistor device fabricated from spin crossover complexes. The ferroelectric layer may be a molecular ferroelectric that also serves as one of the gate dielectric layers. Although not shown in FIG. 8, the transistor device may be both top and bottom gated, so as to provide uniform electric field across the ferroelectric, which can provide uniform ferroelectric polarization in the ferroelectric dielectric layer.

While the devices made so far have source to drain on-state resistances of 10$^3$ Ω·cm, there are known options, from ongoing chemistry, where the on-state resistance could be as low as 0.5 Ω·cm. These other spin crossover molecules have not been yet fabricated into a working nonvolatile molecular transistor, but if applicable from fabrication point of view, for a transistor at the 10 nm node with the channel at 0.5 Ω·cm resistance, this would lead to a source to drain resistance of 2.5 MΩ in a spin crossover transistor device 10 nm wide and 2 nm thick.

Regarding device switching speed, there are spin crossover complexes that may have spin state switching speeds adequate for a competitive device. A number of measurements suggest sub-picosecond switching speeds. This means that the switching speed is limited by the switching speed of the ferroelectric. For copolymers of polyvinylidene fluoride (PVDF), this means that reversal of a ferroelectric domain will take far longer than a nanosecond, because of the need to rotate the —CH$_2$CF$_2$— chemical formulae units. Benzimidazole, 2-methylbenzimidazole, 5,6-dichloro-2-methylbenzimidazole, bridged bis(benzimidazole) and croconic acid are molecular ferroelectrics that require far less dramatic atomic repositioning and thus potentially should have faster ferroelectric polarization switching speeds.

Device switching speed is not simply determined by the switching speed of the molecular state and configuration. Resistance can play a big role in determining the overall operational speed of the device. This latter point is complicated not just by the resistance of the spin crossover molecular layer, which acts to reduce the operation speed of the device, but a variety of parasitic capacitances. The demonstration that magnetic field reduces the activation barrier separating the high and low spin states does suggest that faster switching speed may be possible with the application of a magnetic field, but this may be an unwanted complication in the implementation of nonvolatile multiferroic molecular devices, fabricated from spin crossover molecular complexes for memory. In addition, contact potential can have an impact on device speed.

Regarding device endurance, molecular devices are generally considered very fragile compared to inorganic devices. However, there have been molecular spin crossover devices fabricated that have been shown to undergo 10 million switches without degradation. These demonstration spin crossover molecular devices were not designed for nonvolatile voltage-controlled memory applications, but provide evidence in favor of spin crossover molecular device endurance.

Regarding the ability of having a device with a transistor channel width of 10 nm or below, it has been found that devices at the 10 nm scale are possible. With almost all devices dependent on magnetoelectric coupling, there is the concern that there is a limit to the device size. In other words, there is concern that the magnetoelectric coupling either suffers from some sort of finite scaling or that there is a critical volume where magnetoelectric coupling simply fails. In the case of spin crossover systems, spin state switching at room temperature has been demonstrated to the 3.6±0.8 nm scale. This demonstration provides considerable evidence that devices at the 10 nm scale are possible, and this would be competitive with silicon (e.g., CMOS) technologies. Yet the on-state resistance, however, is high, as discussed above. Even a decrease of the on-state resistance to about 0.5 Ω·cm, through a better choice of spin crossover complex, would still mean a substantial device resistance on the nanometer scale. While the materials properties indicate that spin state switching is possible below 10 nm, the exigencies of device implementation may preclude this implementation of nonvolatile voltage-controlled spin crossover molecular devices at dimensions below 10 nm, as a result of the high on-state resistance as discussed above. Yet, depending on the lithography resolution, the source drain distance could be decreased to lower the device resistance.

If the spin crossover molecular film thickness, acting as the semiconductor channel, is increased to 15 nm, this drops the device source to drain resistance to 667 MΩ. If a spin crossover complex with an on-state resistance of 0.5 Ω·cm is utilized, then the resistance drops further to 333 KΩ. For a transistor at the 20 nm node, this decreases the device source to drain resistance further to 167 KΩ. At the 30 nm node, device source to drain resistance drops even further to 111 KΩ, and at a channel width to 50 nm node, the resistance would about 67KΩ. Accordingly, a thin film molecular memory can include a spin crossover molecular layer having a channel thickness of at least 10 nm.

The following table shows spin crossover molecular multiferroic field effect transistor characteristics as demonstrated in a nonvolatile voltage-controlled device (experiment) and what might be possible from other experiments on spin crossover complexes.

| | Molecular Multiferroic FETs | |
|---|---|---|
| | Possibilities | Demonstrated in a device |
| minimum size | 3.6 ± 0.8 nm | — |
| switching speed | <1 ps | — |
| on state resistance | 0.03 Ω · cm | $10^3$ Ω · cm |
| on/off ratio | $10^4$ | $10^2$ |
| # of switches | $10^7$ | — |
| coercive voltage | 50 mV, <0.2 V | 25 V |
| upper bound operational temperature | 400 K | 350 K |
| peak current density | $3.6 \times 10^5$ A · $cm^{-2}$ | — |
| write energy/bit | 0.7 fJ | — |
| silicon compatible | yes | yes |

The speed of the memory read is the major factor of concern when considering device resistance. There is no hard limit to resistance maximum, but for every doubling of memory resistance, to a first order approximation, the read time doubles. For some types of memory, for example NAND flash, a very slow read time is acceptable, but this is in order to achieve a very compact memory cell. In the case of magnetoelectric memory cells, the base cell size is bigger than the flash cell, and so this arena of very compact memory is not an area where nonvolatile multiferroic molecular devices, fabricated from spin crossover molecular complexes, is likely to be competitive. Instead, the target for nonvolatile multiferroic molecular devices, fabricated from spin crossover molecular complexes, is faster cache memories. With these possible implementations, it is acceptable to increase the width of the memory cell, within limits, and a cell width up to about 80 nm (with gate length of 12 nm) may be acceptable. A major advantage of the nonvolatile multiferroic devices, fabricated from spin crossover molecular complexes is that there is the possibility of 3D integration of this technology, which can drastically increase the memory capacity. The fact that the multiferroic molecular device fabrication temperatures are low allows many layers of such devices to be fabricated on a silicon chip without damaging the underlying Si transistor devices. This becomes particularly interesting in the case of crossbar arrays of nonvolatile multiferroic molecular devices, as in that implementation, one does not need one Si transistor per each cell.

The nonvolatile multiferroic devices fabricated from spin crossover molecular complexes also appear to be competitive with zinc-tin oxide thin-film transistors and other amorphous oxide semiconductor transistor schemes that might be used in flexible electronics like displays. The nonvolatile multiferroic devices fabricated from spin crossover molecular complexes are molecular thin film devices and, thus, flexible.

Recitation of ranges of values herein are merely intended to serve as a shorthand method of referring individually to each separate value falling within the range, unless otherwise indicated herein, and each separate value is incorporated into the specification as if it were individually recited herein. For example, if a thickness range is stated as 1 to 50, it is intended that values such as 2 to 40, 10 to 30, or 1 to 3, etc., are expressly enumerated in this specification. These are only examples of what is specifically intended, and all possible combinations of numerical values between and including the lowest value and the highest value enumerated are to be considered to be expressly stated in this disclosure. In addition, a value of a structural parameter is intended to include process tolerances (e.g., where a value such as 1 nm should be understood to cover that value +/−a tolerance value) due to fabrication tolerances and depends on technology node.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A system, comprising:
   a circuit substrate; and
   a thin film molecular memory deposited on the circuit substrate in a back end of line process, wherein the thin film molecular memory comprises a memory device formed of a ferroelectric layer directly adjacent to a spin crossover molecular layer having a channel thickness of 10 nm to 50 nm.

2. The system of claim 1, wherein the memory device is a two-terminal diode memory device.

3. The system of claim 1, wherein the memory device is a four-terminal transistor memory device.

4. The system of claim 1, wherein the ferroelectric layer is fabricated by\evaporation.

5. The system of claim 1, wherein the ferroelectric layer is fabricated by Langmuir-Blodgett thin film growth.

6. The system of claim 1, wherein the ferroelectric layer comprises dipolar molecular additives.

7. The system of claim 1, wherein the ferroelectric layer comprises an organic ferroelectric material.

8. The system of claim 1, wherein the ferroelectric layer comprises benzimidazole, 2-methylbenzimidazole, 5,6-dichloro-2-methylbenzimidazole, bridged bis(benzimidazole), croconic acid, or a copolymer of polyvinylidene fluoride.

9. The system of claim 1, wherein the circuit substrate comprises transistor devices.

10. The system of claim 9, wherein the memory device of the thin film molecular memory is provided in plurality, wherein the plurality of memory devices is electrically connected to the transistor devices of the circuit substrate.

11. The system of claim 10, wherein the plurality of memory devices is electrically connected to the transistor devices of the circuit substrate through vias and metal lines in the circuit substrate.

12. The system of claim 9, wherein the transistor devices comprise complementary metal oxide semiconductor (CMOS) transistors.

13. A memory device comprising:
    a ferroelectric layer less than 5 nm thick directly adjacent to a spin crossover molecular layer having a channel thickness of at least 10 nm.

14. The memory device of claim 13, wherein the memory device is a two-terminal diode memory device.

15. The memory device of claim 13, wherein the memory device is a four-terminal transistor memory device.

16. The memory device of claim 13, wherein the ferroelectric layer is fabricated by evaporation.

17. The memory device of claim 13, wherein the ferroelectric layer is fabricated by Langmuir-Blodgett thin film growth.

18. The memory device of claim 13, wherein the ferroelectric layer comprises dipolar molecular additives.

19. The memory device of claim 13, wherein the ferroelectric layer comprises an organic ferroelectric material.

20. The memory device of claim 13, wherein the ferroelectric layer comprises benzimidazole, 2-methylbenzimidazole, 5,6-dichloro-2-methylbenzimidazole, bridged bis (benzimidazole), croconic acid, or a copolymer of polyvinylidene fluoride.

* * * * *